United States Patent

Hsu et al.

Patent Number: 6,077,782
Date of Patent: Jun. 20, 2000

[54] METHOD TO IMPROVE THE TEXTURE OF ALUMINUM METALLIZATION

[75] Inventors: Wei-Yung Hsu; Qi-Zhong Hong, both of Dallas; Robert H. Havemann, Garland, all of Tex.

[73] Assignee: Texas Instruments Incorporated, Dallas, Tex.

[21] Appl. No.: 09/023,424

[22] Filed: Feb. 13, 1998

Related U.S. Application Data

[60] Provisional application No. 60/039,272, Feb. 28, 1997.

[51] Int. Cl.$^7$ ...................................... H01L 21/44
[52] U.S. Cl. .......................... 438/688; 438/643; 438/687; 438/637; 438/624
[58] Field of Search ..................................... 438/688, 687, 438/624, 642, 643, 644, 648, 656, 672, 674, 675, 637

[56] References Cited

U.S. PATENT DOCUMENTS

| | | | |
|---|---|---|---|
| 5,580,823 | 12/1996 | Hegde et al. | 438/648 |
| 5,627,102 | 5/1997 | Shinriki et al. | 438/648 |
| 5,652,464 | 7/1997 | Liao et al. | 257/751 |
| 5,776,831 | 7/1998 | Padmanabhan et al. | 438/653 |

*Primary Examiner*—Charles Bowers
*Assistant Examiner*—Thanh Nguyen
*Attorney, Agent, or Firm*—Mark A. Valetti; Carlton H. Hoel; Frederick J. Telecky, Jr.

[57] ABSTRACT

A method to improve the texture of titanium and aluminum to reduce electromigration by controlling the deposition conditions and the texture of the substrates. Aluminum films can develop strong <111> texture, when titanium is used underneath aluminum. However, to prevent the interaction between aluminum and titanium, a layer of TiN or other barrier is necessary. Fortunately, TiN has a similar atom arrangement on the <111> plane as that of aluminum <111> and titanium <002>. Therefore, by controlling the orientation of titanium using a pre-sputter argon etch and low titanium deposition temperature, the texture of titanium can be transferred to TiN, and subsequently to aluminum.

14 Claims, 3 Drawing Sheets

METHOD TO IMPROVE THE TEXTURE OF ALUMINUM METALLIZATION

This is a Non Provisional application filed under 35 USC 119(e) and claims priority of prior provisional, Ser. No. 60/039,272 of inventor Hsu, et al., filed Feb. 28, 1997.

BACKGROUND AND SUMMARY OF THE INVENTION

The present invention relates to integrated circuit structures and fabrication methods.

Background: Aluminum Texture and Electromigration

Recently, contact and via filling with aluminum alloys has attracted a great deal of attention. Compared with contact/via filling with chemical vapor deposition (CVD) tungsten, aluminum filling has the advantages of lower cost, higher yield, and potentially better electromigration resistance (since there is less flux divergence near the plug).

There are two main categories of aluminum filling processes, one with elevated temperature and another one with high pressure to enhance the aluminum transport to achieve complete filling of cavities (via, contacts, or trenches). Both methods require a degas step prior to liner deposition, to desorb the moisture, oxygen, or other volatile species from the dielectric on the sidewall of contacts and vias. Inadequate degas will hamper the filling process. Furthermore, an etch step is essential to clean the bottom of contacts or vias. This step removes residues from the contact/via etch step and/or the native oxide formed on the lower level metallization after being exposed by the contact/via etch step and thereby lowers the contact resistance.

Electromigration is one of the long-standing liabilities of aluminum metallization. Nevertheless, some improvement can be achieved by using aluminum which has crystal grains oriented primarily in the <111> direction. See e.g. Shibata et al., "The Effects of Al <111> Crystal Orientation on Electromigration in Half-Micron Layered Al Interconnects," 32 JAPANESE J. APPL. PHYS. 4470 (1993); Kondo et al., "Effects of Grain Size and Preferred Orientation on the Electromigration Lifetime of Al-Based Layered Metallization," 78 J. APPL. PHYS., 6534 (1995); and Tracy et al., "Texture in Multilayer Metallization Structures," 76 J. APPL. PHYS. 2671 (1994), all of which are hereby incorporated by reference.

Thus the formation of aluminum alloy thin films with a strong <111> texture enhances the electromigration resistance. The crystal-line orientation ("texture") of polycrystalline aluminum alloy films depends on the deposition parameters, thermal history, and on the liners underneath. Titanium and TiN are the most commonly used liners. Currently, in aluminum via/contact filling processes with high pressure extrusion, poor aluminum texture has resulted in a wider electromigration (EM) lifetime distribution, which is undesirable. This poor aluminum texture is due, in part, to poor TiN texture under the aluminum film. Therefore, in order to reduce electromigration, it is necessary to improve the texture of titanium and TiN, toward titanium <002> and TiN <111>, to produce an aluminum film with a <111> texture.

There have been several proposed methods to optimize the deposition parameters of titanium and TiN to improve the texture. One such proposed method suggested that improved Ti <002> can be obtained if the titanium film is deposited at a low temperature. Although low titanium temperature can improve the texture, adequate wafer heating during liner deposition is required to improve the film's uniformity, lower the resistance, and reduce the stress. Another known method found that the texture of titanium films also depends on the surface roughness of various oxides. After chemical mechanical polishing (CMP) to reduce the surface roughness of oxide, dramatic improvement in the titanium preferred orientation was observed. Another proposed solution suggested that by argon sputter etch, the titanium preferred orientation can be improved, in addition to the texture of aluminum in the aluminum/titanium and aluminum/TiN/titanium metal stacks. However, in this solution, thermal oxide was used as substrate, and due to the high process temperature required (typically greater than 800 degrees C), thermal oxide cannot be used as an interlevel dielectric where aluminum is used as a metal interconnect.

Method to Improve Texture

The present application discloses a new method to improve the texture of titanium and aluminum, which will reduce electromigration by controlling the deposition conditions and the texture of the substrates. Aluminum films can develop strong <111> textures, when titanium is used underneath aluminum. However, to prevent the interaction between aluminum and titanium, a layer of TiN or other barrier is necessary. Fortunately, TiN has an atomic arrangement on the <111> plane which is similar to those of aluminum <111> and titanium <002>. Therefore, by controlling the orientation of titanium using a pre-sputter argon etch and low titanium deposition temperature, the texture of titanium can be transferred to TiN, and subsequently to the top metal layer. This method is particularly useful for advanced aluminum or copper metallization applications.

The advantages provided by the innovative method of the present invention include:

manufacturable;

effective in improving titanium and aluminum textures;

particularly effective in improving the texture of aluminum in the field; and compatible with current process flows.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The innovative method of the present invention reduces electromigration by improving the texture of titanium and aluminum. Aluminum films can develop strong <111> texture by controlling the orientation of the underlying layer of titanium. The texture of titanium can then be transferred to an intermediate barrier layer, e.g. TiN, and then to the aluminum film. In this arrangement, TiN has a similar atom arrangement on the <111> plane as that of aluminum <111> and titanium <002>.

As shown in the following table, the textures of the aluminum samples were evaluated at various process conditions to determine the full width at half maximum (FWHM) value of the <111> rocking curve of the aluminum films. This measures the misalignment of grains; a smaller FWHM value is better than a larger value. It has been shown that the electromigration (EM) lifetime of aluminum interconnections increases as the FWHM value decreases. It has also been shown that tighter grain size distribution improves EM lifetimes. The process described in the present application also produces a tighter distribution of grain sizes, and hence improves EM lifetimes in this way also.

From these results, it was concluded that combination of damages induced by an Ar pre-sputter etch and high Ti deposition temperature resulted in poor titanium and aluminum textures. Thus the most important factors that need to be controlled include the surface condition (e.g. surface roughness, chemistry etc.) after pre-sputter etch clean, and the titanium deposition temperature.

| Degas | Pre-Sputter Etch | Aluminum <111> FWHM |
|---|---|---|
| Y | Y | no texture (with standard process) |
| N | N | 1.95 degree |
| Y | Y | 4.3 degree (with 99 sec. stabilization at titanium deposition) |

Figure 1:
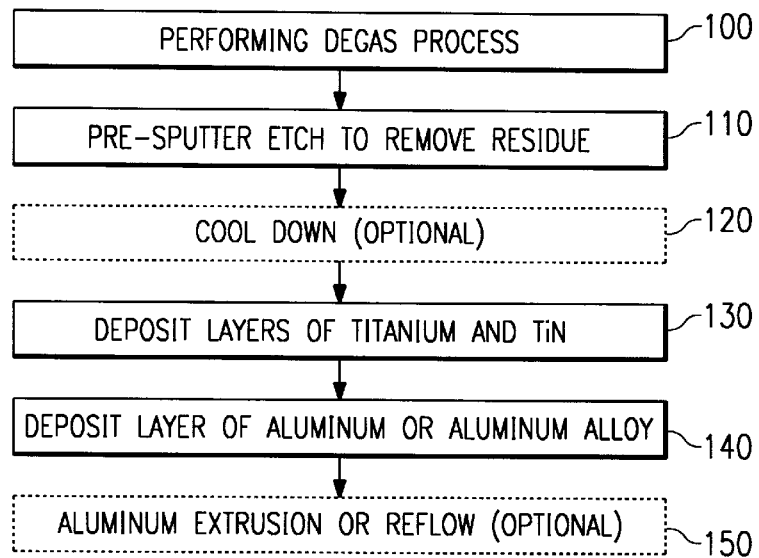
FIG. 1 shows a process flow for improving the texture of aluminum in accordance with a preferred embodiment of the present invention.
Figure 2A:
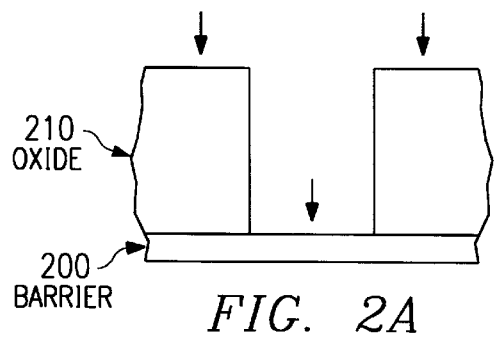
FIGS. 2A–2E shows the formation of an aluminum film with a <111> texture.

Based on these results, a process flow demonstrating a preferred method to improve the textures is shown in FIG. 1. FIG. 1 will be explained in conjunction with the cross-sectional diagrams of FIGS. 2A–2E. As can be seen in FIG. 2A, starting with a metal or barrier layer 200 (e.g. aluminum for via applications, silicon for contact applications) and the formation, patterning, and etching of an oxide layer 210, a degas step is performed (step 100) at a temperature of around 400 degrees C to remove volatile H2O, O2 or any other gas that will be released later during either aluminum deposition (if a tungsten plug is used), aluminum reflow (if reflow is used), or aluminum extrusion (if high pressure extrusion is used).

Subsequently, a pre-sputter etch is performed (step 110) to remove the oxidation layer on top of the metal or barrier layer 200 and other via/contact etch residue. The etch condition should be optimized to minimize the surface roughening or damage to the oxide on the field. Preferably, the pre-sputter clean (step 110) uses a reactive ion etching (RIE), a combination of argon/hydrogen, or a combination of sputter etch and HF vapor or other vapor treatment. Other methods that clean the metal on the bottom of the contact or via and do not result in a rough or damaged surface on the field can also be used.

Figure 2B:
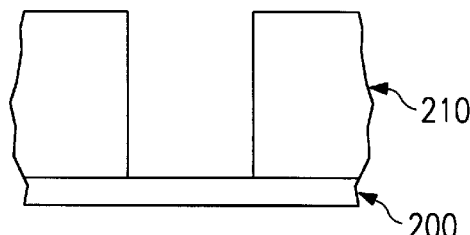
Figure 2C:
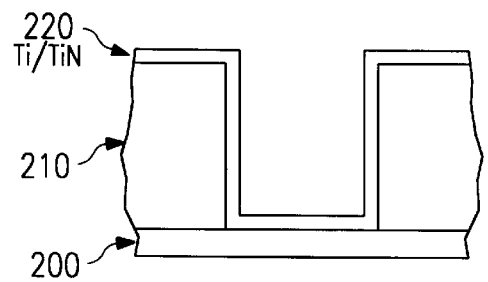
Figure 2D:
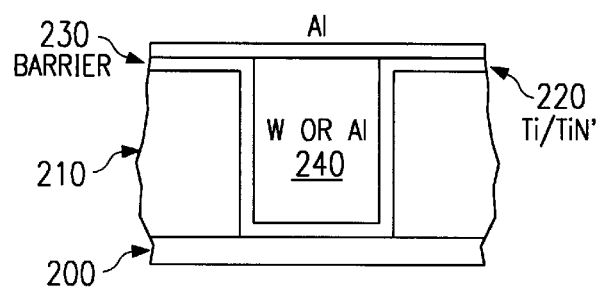
Figure 2E:
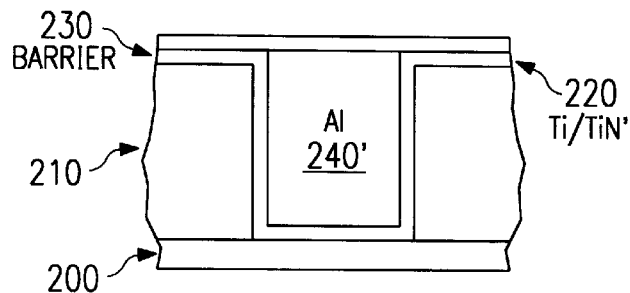

An optional cool down step (step 120), illustrated in FIG. 2B, follows the pre-sputter clean step (step 110). This cool down can be performed in a cool down chamber or in a load-lock, if the vacuum integrity in the load-lock is adequate. However, if the surface is smooth and undamaged after the pre-sputter clean, this step is optional. Thereafter, layers of titanium and TiN 220 are deposited (step 130) at temperatures in the range of 200–350 degrees C, as can be seen in FIG. 2C. As shown in FIG. 2D, if a tungsten plug 240 is used, the aluminum deposition (step 140) follows an etch back or chemical mechanical polishing step of the tungsten. However, as shown in FIG. 2E, if an aluminum plug 240' is used, the aluminum deposition (step 140) is performed with the plug processing. Optionally, aluminum extrusion or reflow (step 150) can be performed if via/contact filling by aluminum is required.

Figure 3:
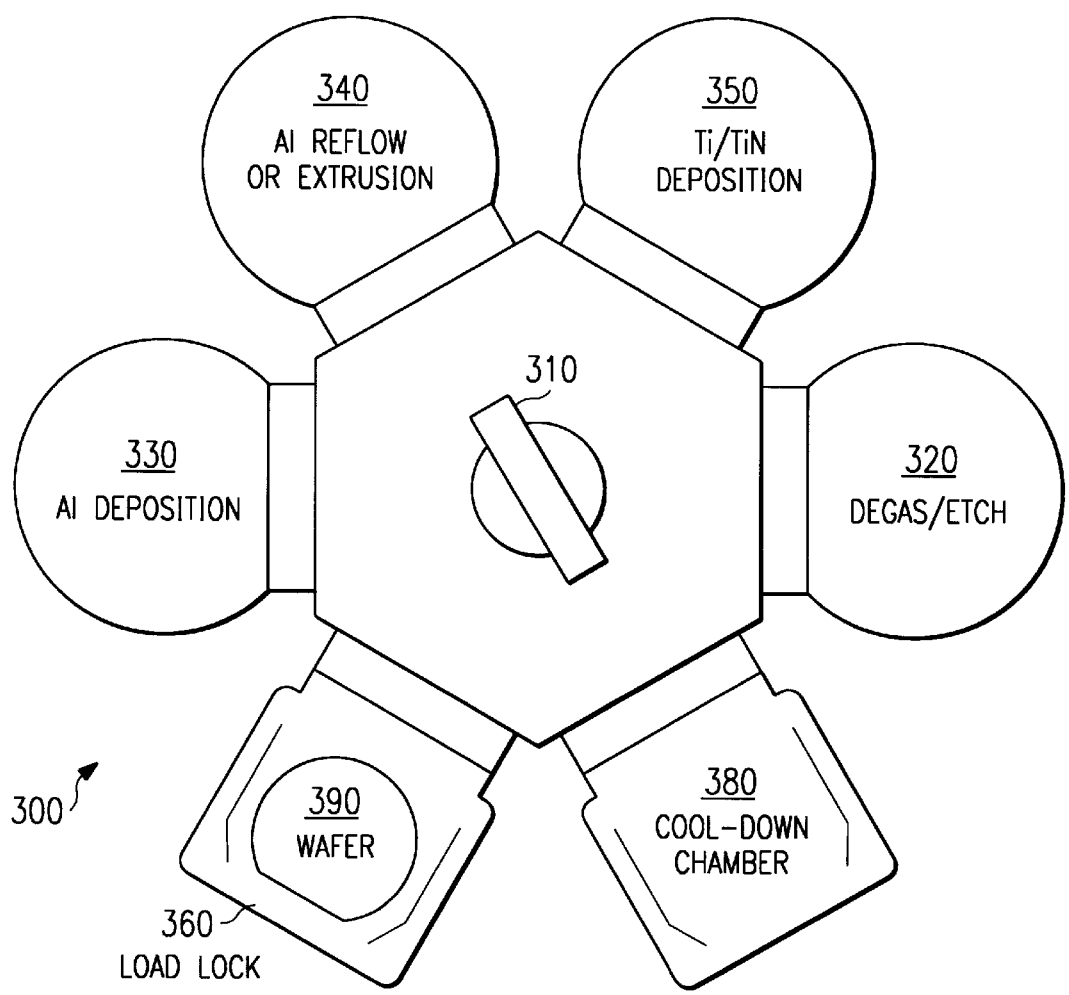
FIG. 3 shows a cluster tool used in a preferred embodiment of the present invention.

FIG. 3 shows a sample cluster tool which can preferably be used to implement the innovative method described herein. The cluster tool 300 contains four separate chambers 320, 330, 340, and 350 for carrying out the various steps involved in this process along with load-lock 360, cool-down chamber 380 and a cryopump (not shown). A wafer 390 is first loaded into the cluster tool 300 through the load-lock and transferred (by a handling mechanism 310) into the first chamber 320 to perform the degas and pre-sputter etching processes to remove volatile gases and etch residue from the surface of the oxide and exposed barrier layers. The wafers are then cooled in the load-lock 360, provided the vacuum integrity of the load-lock is adequate, or cool-down chamber 380. Subsequently, the deposition of titanium and TiN occurs in the second chamber 350 followed by the deposition of aluminum or an aluminum alloy in the third chamber 330. The fourth chamber 340 can be used for the aluminum extrusion or reflow processes if via/contact filling by aluminum is required.

Sample Embodiment: Contact Filling

The following data gives results from actual test runs using sample embodiments of the present invention. Six inch silicon wafers coated with 500 nanometers of oxide deposited by plasma enhanced chemical vapor deposition (PECVD) from a TEOS precursor were used as substrates. This type of oxide is usually designated as PETEOS. The PETEOS was deposited at a wafer temperature of 380 degrees C. The titanium, TiN, and aluminum-0.5 percent copper films were deposited with Electrotech Sigma, equipped with a high pressure module to extrude the aluminum alloy into via/contacts.

A sample high pressure aluminum extrusion contact/via filling process consists of the following steps: degas, argon sputter etch, titanium and TiN deposition, aluminum alloy deposition to bridge the opening of the cavities in the dielectric, extrusion of the aluminum alloy film with pressurized argon at elevated temperatures, and TiN anti-reflection layer deposition. With the high pressure extrusion process, complete filling of 0.2 micrometer cavities with aluminum has been demonstrated.

| First Chamber | |
|---|---|
| Degas | |
| Temperature | 400 degrees C. |
| Time: | 2–4 minutes |

-continued

First Chamber

Argon Sputter Etch

| | |
|---|---|
| Temperature: | 400 degrees C. |
| Removal of Oxide: | 45 nanometers |

The argon sputter etch used induction coupled plasma (ICP) to improve the etch rate at the bottom of the contacts or vias and to reduce the etch damage. Long-throw geometry was used to improve the bottom and sidewall coverage of titanium and TiN. TiN was deposited by reactive sputtering. Titanium and TiN were deposited in the same chamber, therefore, a shuttered target clean step was added between the TiN and titanium deposition steps to remove the TiN from the target surface. The aluminum film was deposited with standard magnetron sputtering.

Second Chamber
Titanium and TiN Sputter Deposition

| | |
|---|---|
| Pressure: | 2.5 mTorr |
| Ti: | 6 KW 1.2 nm/s 50 sccm of Ar |
| Titanium Thickness: | 40 nanometers |
| TiN: | 12 KW in 70 sccm N2 and 20 sccm Ar to produce a deposition rate of 0.8 nm/s |
| TiN Thickness: | 50 nanometers |

Third Chamber
Aluminum - .5 percent Copper

| | |
|---|---|
| Heater Temperature: | 450 degrees C. |
| Al:Cu: | 15 KW with a flow of 100–110 sccm of Ar producing a net deposition rate of 20.8 nm/sec |
| Thickness: | 700 nanometers |

The aluminum alloy is then forced into the cavity by high pressure Ar or other gas (60–90 MPa), at a temperature of 400 degrees C or more.

Sample Embodiment: Via Filling

In this alternative embodiment, the underlying layer is a "metal-1" layer, which is a patterned layer of aluminum alloy overlaid by an antireflective coating of titanium nitride (TiN). Other process parameters are generally the same as those given above.

Experimental Verification

The crystallinity and orientation of the titanium, TiN, and aluminum films were evaluated with X-ray diffraction including both theta-two theta normal scan and rocking-curve scan. The preferred orientation of various wafers was compared based on the full-width-at-half-maximum (FWHM) of the aluminum <111> rocking curve spectrum. The oxide surface chemistry was evaluated with TOF-SIMS. The oxide surface roughness was evaluated with an Atomic-Force-Microscope (AFM). The scan area for AFM was 2×2 micrometers. The surface tension of the oxide surface before and after the argon etch was evaluated by measuring the contact angle of a water drop on the surface of the oxide.

Figure 4:
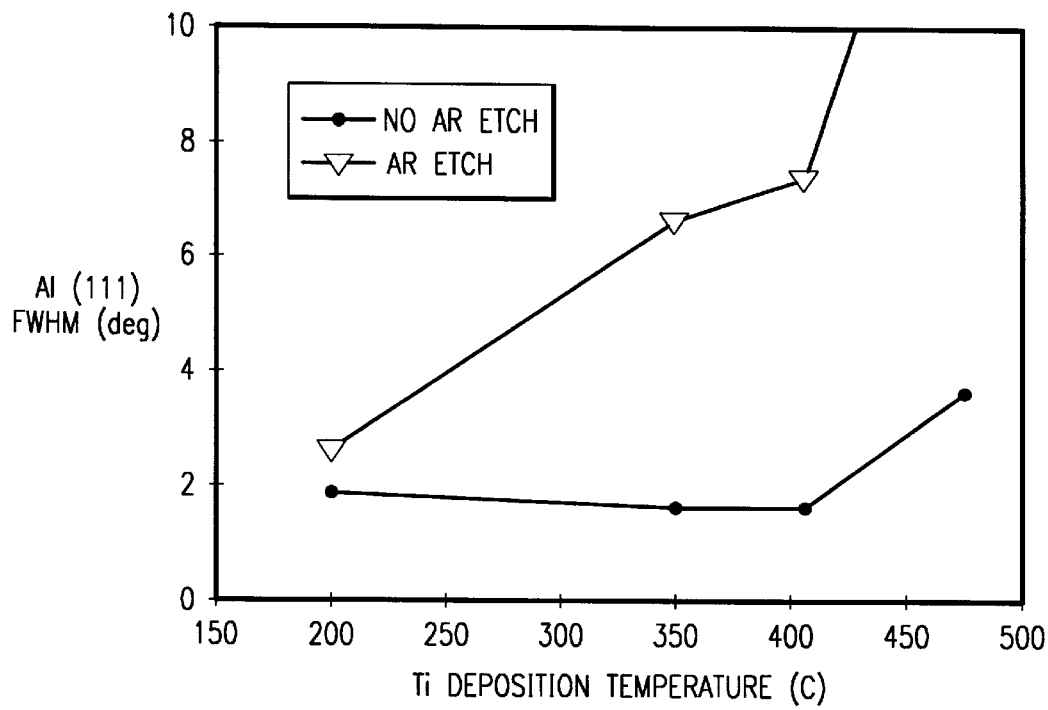
FIG. 4 shows the variation of aluminum <111> FWHM with the TiN/titanium deposition temperature.

Only aluminum <111> was observed for wafers with and without the argon sputter etch, but wider aluminum <111> grain distribution was observed with the argon etch prior to the titanium deposition. FIG. 4 shows the variation of the aluminum <111> FWHM with the TiN/titanium deposition temperature. To avoid the effect of degas temperature on the effective temperature of the wafers, the wafers were degassed at a wafer temperature of 50 degrees C above the TiN/titanium deposition wafer temperature. For wafers with the argon sputter etch, the aluminum <111> FWHM increased with titanium/TiN deposition temperature, from 2.7 degrees at 200 degrees C to 7.2 degrees at 410 degrees C. At 470 degrees C, random distribution was observed. Without the argon etch and below 410 degrees C titanium deposition temperature, slight temperature dependence of aluminum texture on the titanium deposition temperature was observed, while there was a sharp increase from 1.5 degrees at 410 degrees C to 3.2 degrees at 470 degrees C.

Figure 5:
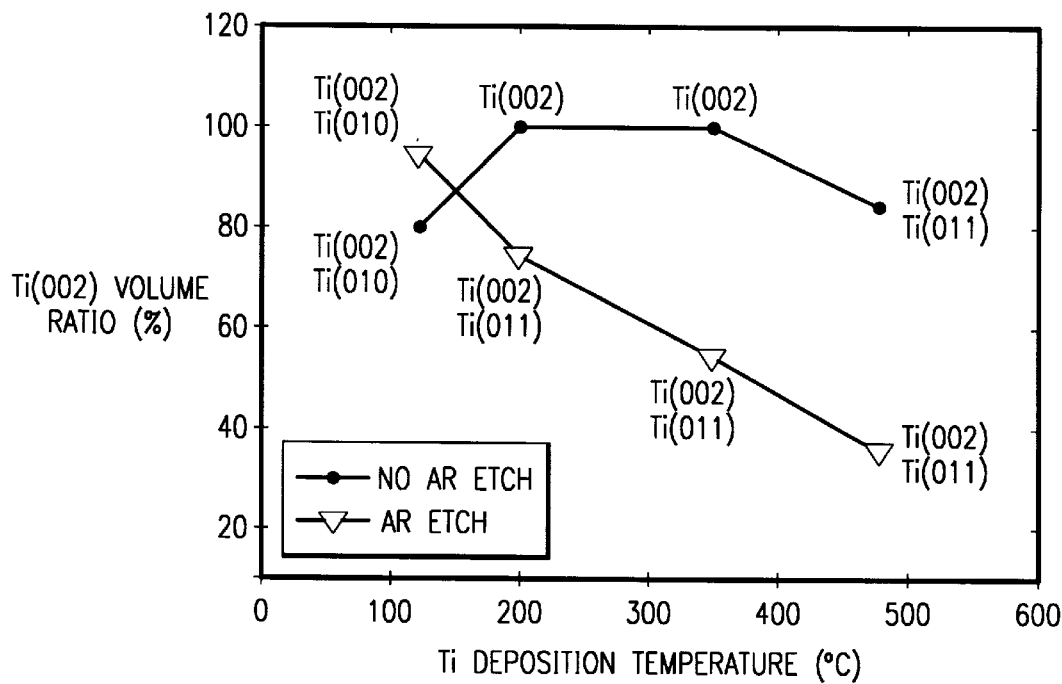
FIG. 5 shows the effect of deposition temperature and argon sputter etch on the titanium texture.

The effect of deposition temperature and the argon sputter etch on the titanium texture is shown in FIG. 5. For wafers without the argon sputter etch, mixed <002> and <011> was observed at a titanium deposition temperature of 470 degrees C, and mixed <002> and <010> was observed at 120 degrees C. Between 120 degrees C and 470 degrees C, only titanium <002> was observed. The degradation of titanium <002> was parallel with the widening of the aluminum <111> FWHM. As titanium <010> and titanium <011> are not closely matched to titanium <002>, TiN <111> and aluminum <111>, it can be concluded that the degradation of the aluminum <111> texture in the aluminum/TiN/titanium stack was due to the degradation of the titanium <002> texture, induced by increasing the titanium deposition temperature. With the argon sputter etch, the effect of the temperature was more profound.

It has been known that the oxide surface roughness affects the titanium texture and that a smooth oxide will result in a tighter titanium <002> texture distribution. It has been speculated that titanium tended to grow with <002> and <011> planes parallel to local oxide surfaces. Thus, the deviation of local oxide surfaces due to surface roughness results in the deviation of titanium <002> and titanium <011> from wafer surface normal. Smoother oxide surfaces were observed on PETEOS after an argon sputter etch. The following data illustrates results obtained with an argon etch.

| Etch | Zmax (nm) | Roughness (nm RMS) | Oxygen Content* | Contact angle (degree) |
|---|---|---|---|---|
| no Ar etch | 4.6 +/− .7 | .51 +/− 0.02 | 1.7 | 5 |
| Ar etch | 2.74 +/− .31 | .33 +/− 0.01 | 3.0 | 19 |

*oxygen content was characterized by the intensity ratio of Si2O+ and Si2+ molecular fragments.

As shown above, after the argon sputter etch, the surface roughness was reduced from a root-mean-square (RMS) roughness of 0.51+/−0.02 nm to 0.33+/−0.01 nm. Also shown above is the surface chemistry and water contact angle of PETEOS oxide surface with and without the argon etch. The data indicates that the argon sputter etch results in a slightly oxygen enriched surface on the PETEOS layer, compared to that without the argon etch. The water contact angle on PETEOS films with the argon etch is much larger than that on wafer without the argon etch. This observation implies that the argon sputter etch decreases the surface tension of PETEOS.

The argon etch reduces the surface energy of the PETEOS by changing the surface chemistry. This decreased surface energy hampers the layer-by-layer growth of the titanium <002> plane parallel to the PETEOS surface. However, at lower titanium deposition temperatures, the effect of the surface roughness prevails. A smoother oxide surface induced by argon sputter etch results in a tighter titanium and aluminum grain orientation distribution in the aluminum/TiN/titanium metal stack. With the argon etch, 100 nm of titanium deposited at 120 degrees C results in a titanium <002> plane that was distributed around surface normal with a FWHM of 2.7 degrees, while that on PETEOS without the argon etch has a titanium <002> FWHM of 5.8. degrees. This is a significant improvement in the titanium texture by using the argon sputter etch.

In conclusion, an argon sputter etch results in the modification of the surface chemistry and roughness of PETEOS oxide films on silicon substrates. Combined with higher deposition temperatures, an argon etch degraded the crystalline texture of titanium and aluminum in the aluminum/TiN/titanium stack. One contributing factor of the degradation of the titanium texture is due to the difference in the surface tension associated with different oxide surface chemistries. To achieve an improved titanium texture on PETEOS with an argon sputter etch, a lower titanium deposition temperature needs to be used.

Alternative Embodiment I: Low Damage Ar Sputter Etch

By lowering the Ar sputter etch temperature, the damage to the oxide surface can be reduced. As shown in the following table, texture of aluminum films in the Al/TiN/Ti metal stack was improved from random to 4 degree.

| Ar Pre-Sputter Temperature (C.) | Aluminum Texture (Degree) |
| --- | --- |
| 200 | 4 |
| 350 | 5.2 |
| 610 | random |

A predicted alternative embodiment is as follows: After the degas (step 100, shown in FIG. 1), wafers are pre-sputter etched at lower temperature (step 110). Etch can be performed in the same chamber, by lowering the temperature of the heater, or in a separate chamber with lower wafer temperature. Sufficient time should be provided to lower the temperature of the wafers before Ar sputter etch.

After Ar sputter clean, the wafers are then transferred to the Ti deposition chamber for Ti deposition (step 130) preferably at low temperature (<350C heater temperature).

Wafers are then processed with plug formation and aluminum metallization deposition. If a tungsten plug is used, then an aluminum film is deposited after tungsten film etch-back or chemical mechanical polishing. If an aluminum plug is used, then the aluminum deposition (step 140) is part of the plug formation.

Alternative Embodiment II: Texture Improvement for Cu Metallization

Copper films can also be improved with a textured TiN as liner; a predicted alternative embodiment is as follows. The Ti and TiN textures can be improved if wafers have been processed through the degas, pre-sputter etch, and Ti/TiN deposition steps proposed in preferred embodiment and alternative embodiment I. This textured TiN/Ti stack can then serve as template for textured copper film formation.

According to a disclosed class of innovative embodiments, there is provided: A fabrication method, comprising the steps of: (a) performing degas and sputter etch operations on a partially fabricated integrated circuit structure having openings in a dielectric layer which .expose portions of underlying structures; (b) depositing a first metal layer on the surface of said dielectric layer and within said openings to coat the sides of said openings and said exposed portions of said underlying structures; (c) forming a conductive diffusion barrier layer over at least part of said metal layer; and (d) depositing a second metal layer over said barrier layer; whereby the texture of said additional metal layer is improved.

According to another disclosed class of innovative embodiments, there is provided: A method of improving the texture of an aluminum surface, comprising the steps of: (a) performing degas, sputter etch, and cool down operations on a partially fabricated integrated circuit structure having openings in a dielectric layer which expose portions of underlying structures; (b) depositing a first metal layer on the surface of said dielectric layer and within said openings to coat the sides of said openings and said exposed portions of said underlying structures; (c) forming a barrier layer over at least part of said metal layer; and (d) depositing a second metal layer predominantly comprising aluminum over said barrier layer; whereby the texture of the surface of said second metal layer is improved.

According to another disclosed class of innovative embodiments, there is provided: A method of improving the texture of an aluminum surface, comprising the steps of: (a) performing degas, sputter etch, and cool down operations on a partially fabricated integrated circuit structure having openings in a dielectric layer which expose portions of underlying structures; (b) depositing a first metal layer, which predominantly comprises titanium, on the surface of said dielectric layer and within said openings to coat the sides of said openings and said exposed portions of said underlying structures; (c) forming a diffusion barrier layer, which predominantly comprises titanium nitride, over at least part of said metal layer; and (d) depositing a second metal layer, which predominantly comprises aluminum, over said barrier layer; whereby the texture of the surface of said second metal layer is improved.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Of course, the specific etch chemistries, layer compositions, and layer thicknesses given are merely illustrative, and do not by any means delimit the scope of the claimed inventions.

What is claimed is:

1. A fabrication method, comprising:
   (a.) performing degas and sputter etch operations on a partially fabricated integrated circuit structure having openings in a dielectric layer which expose portions of underlying structures;
   (b.) depositing a first metal layer on a surface of said dielectric layer and within said openings to coat sides of said openings and said exposed portions of said underlying structures, said first metal layer having a texture;
   (c.) forming a conductive diffusion barrier layer over at least part of said first metal layer, with a texture which is substantially aligned to the texture of said first metal layer;
   (d.) depositing a second metal layer over said barrier layer, with a texture which is substantially aligned to the texture of said barrier layer;
and wherein a cool down step is performed after performing said degas operation and prior to said sputter etch operation and whereby the texture of said second metal layer is improved.

2. The method of claim 1, wherein said depositing a first metal layer and said forming a conductive diffusion barrier layer is performed at a temperature in the range of 200 degrees C to 350 degrees C.

3. The method of claim 1, wherein said first metal layer predominantly comprises aluminum.

4. The method of claim 1, wherein said barrier layer comprises TiN.

5. The method of claim 1, wherein said second metal layer predominantly comprises aluminum.

6. The method of claim 1, wherein said second metal layer has a <111> texture.

7. The method of claim 1, wherein said second metal layer comprises copper.

8. The method of claim 1, wherein said sputter etch is performed at a peak temperature less than 410 degrees C.

9. A method of improving texture of an aluminum surface, comprising:
  (a.) performing degas, sputter etch, and cool down operations on a partially fabricated integrated circuit structure having openings in a dielectric layer which expose portions of underlying structures;
  (b.) depositing a first metal layer on [the] a surface of said dielectric layer and within said openings to coat [the] sides of said openings and said exposed portions of said underlying structures, said first metal layer having a texture;
  (c.) forming a barrier layer over at least part of said first metal layer, with a texture which is substantially aligned to the texture of said first metal layer;
  (d.) depositing a second metal layer predominantly comprising aluminum over said barrier layer, with a texture which is substantially aligned to the texture of said barrier layer;
and wherein said cool down operation is performed prior to said sputter etch operation and whereby the texture of said second metal layer is improved.

10. The method of claim 9, wherein said sputter etch operation uses a reactive ion etch.

11. The method of claim 9, wherein said second metal layer has a <111> texture.

12. A method of improving texture of an aluminum surface, comprising:
  (a.) performing degas, sputter etch, and cool down operations on a partially fabricated integrated circuit structure having openings in a dielectric layer which expose portions of underlying structures;
  (b.) depositing a first metal layer, which predominantly comprises titanium with a <002> texture, on a surface of said dielectric layer and within said openings to coat sides of said openings and said exposed portions of said underlying structures;
  (c.) forming a diffusion barrier layer, which predominantly comprises titanium nitride, with a <111> texture, over at least part of said first metal layer;
  (d.) depositing a second metal layer, which predominantly comprises aluminum, with a <111> texture, over said barrier layer, said second metal layer having a surface with a texture;
and wherein said cool down operation is performed prior to said sputter etch and whereby the texture of the surface of said second metal layer is improved.

13. The method of claim 12, wherein said sputter etch process uses a combination of argon and hydrogen.

14. The method of claim 12, wherein said sputter etch is performed with Ar sputtering at room temperature.

* * * * *